(12) United States Patent
Kim et al.

(10) Patent No.: US 6,346,861 B2
(45) Date of Patent: Feb. 12, 2002

(54) PHASE LOCKED LOOP WITH HIGH-SPEED LOCKING CHARACTERISTIC

(75) Inventors: Young-Ho Kim, Chon-Buk; Sang-Heung Lee, Taejon; Heung-Soo Rhee, Taejon; Jin-Yeong Kang, Taejon, all of (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/733,837

(22) Filed: Dec. 7, 2000

(30) Foreign Application Priority Data

Jun. 8, 2000 (KR) ......................................... 2000-31315

(51) Int. Cl.[7] .......................... H03L 7/089; H03L 7/107; H03D 13/00; G01R 25/00
(52) U.S. Cl. .............................. 331/8; 331/1 A; 331/17; 331/25; 327/12
(58) Field of Search .............................. 331/1 A, 8, 17, 331/25; 327/2, 3, 12, 200, 201, 208, 210–212

(56) References Cited

U.S. PATENT DOCUMENTS

| | | | | |
|---|---|---|---|---|
| 4,017,741 A | * | 4/1977 | Briggs ..................... | 307/221 C |
| 4,291,274 A | * | 9/1981 | Suzuki et al. ............... | 328/133 |
| 4,390,797 A | * | 6/1983 | Ishimoto ..................... | 307/264 |
| 5,675,291 A | | 10/1997 | Sudjian ........................ | 331/17 |

* cited by examiner

Primary Examiner—David Mis
(74) Attorney, Agent, or Firm—Blakely Sokoloff Taylor & Zafman

(57) ABSTRACT

A phase locked loop (PLL) is use in a radio communication system such as a frequency mixer, a carrier frequency and the like. The phase locked loop (PLL) includes a phase/frequency detector for comparing a phase/frequency of a reference signal and a feedback signal. The phase/frequency detector includes: a NAND gate logic circuit for NANDing a first signal and a second signal to output a NANDed signal; a first latch unit for latching the NANDed signal and outputting the first signal in response to a reference frequency; and a second latch unit for latching the NANDed signal and outputting the second signal in response to a feedback frequency. The phase locked loop (PLL) further includes a filter controller for changing a bandwidth of a low pass filter in response to an output signal of the phase/frequency detector.

15 Claims, 4 Drawing Sheets

PHASE LOCKED LOOP WITH HIGH-SPEED LOCKING CHARACTERISTIC

FIELD OF THE INVENTION

The present invention relates to a semiconductor device; and, more particularly, to a phase locked loop (PLL) with a high-speed locking characteristic, which is capable of obtaining a fast locking time and a reduced jitter.

DESCRIPTION OF THE PRIOR ART

Generally, a phase locked loop (PLL) is widely used in a radio communication system, such as a frequency mixer, a carrier recovery circuit, a clock generator, a modulator/demodulator, and the like. In particular, systems employing a clock recovery circuit or a frequency hopping spread spectrum require a fast frequency/phase locking.

FIG. 1 is a block diagram showing a conventional PLL.

Referring to FIG. 1, a conventional PLL includes a phase/frequency detector (PFD) 10, a charge pump unit 20, a low-pass filter (LPF) 30, a voltage-controlled oscillator (VCO) 40 and a frequency divider 50.

The PFD 10 compares a phase/frequency of a reference signal $S_R$ having a predetermined frequency $f_R$ with that of a feedback signal $S_F$ having a feedback frequency $f_D$, to thereby obtain a phase/frequency difference therebetween. Then, the PFD 10 produces a sequence of an up pulse UP and a down pulse DN according to the phase/frequency difference.

The charge pump unit 20 converts the phase/frequency difference into a positive pump current signal and a negative pump current signal in response to the up pulse UP and the down pulse DN, respectively.

The LPF 30 converts the positive pump current signal and the negative pump current signal into corresponding voltage signal.

The VCO 40 receives the voltage signal outputted from the LPF 30 and generates an output signal $S_{Out}$ having a predetermined oscillation frequency $f_{ouT}$ that is varied with the inputted voltage signal.

The frequency divider 50 divides the oscillation frequency $f_{OUT}$ to output a divided oscillation frequency $f_D$.

The PFD 10 again compares the reference signal $S_R$ with a feedback signal $S_F$ having the divided oscillation frequency $f_D$ as the feedback frequency. Then, the frequency/phase of the reference signal $S_R$ is synchronized with that of the feedback signal $S_F$ after a predetermined time by repeatedly performing the above-described looping operation.

In case where the reference signal is changed or a frequency division ratio of the frequency divider is changed, the PLL repeats the feedback loop procedures in order to obtain a new fixed phase. At this time, a locking time taken to reach a phase-locked state is determined by a characteristic function of the PLL.

Two methods for reducing the locking time are disclosed in Yasuaki Sumi, "FAST SETTLING PLL FREQUENCY SYNTHESIZER UTILIZING THE FREQUENCY DETECTOR METHOD SPEEDUP CIRCUIT", IEEE Transaction on Consumer Electronics, Vol. 43, No. 3, August 1997.

One method is to employ a frequency detector method speedup circuit (FDMSC). The FDMSC includes a frequency detector for detecting a frequency difference and a charge controller. The charge controller is used to fix an input signal until a first frequency locking is completed when a frequency division ration is changed.

The other method is to add an LPF, which has a changeable-bandwidth, to the FDMSC. In this method, a resistance ratio that determines a gain of an active LPF is adjusted according to a frequency difference. At this time, since the LPF has a smaller time constant only at a rising time, an input voltage signal of the VCO can reach fast a target voltage, thereby reducing the locking time.

In these methods, however, there are problems that a circuit configuration becomes complicated and a chip size is increased, thereby causing an increase in the power dissipation of the PLL.

SUMMARY OF THE INVENTION

It is, therefore, an object of the present invention to provide a phase-locked loop (PLL) which is capable of obtaining a fast locking time and a reduced jitter.

In accordance with an aspect of the present invention, there is provided a phase/frequency detector for comparing a phase/frequency of a reference signal having a reference frequency and that of a feedback signal having a feedback frequency in a phase locked loop (PLL), comprising: a NAND gate logic circuit for NANDing a first signal first signal and a second signal to output a NANDed signal; a first latch means for latching the NANDed signal and outputting the first signal in response to the reference signal; and a second latch means for latching the NANDed signal and outputting the second signal in response to the feedback signal.

In accordance with another aspect of the present invention, there is provided a phase locked loop (PLL) comprising: a phase/frequency detection means for comparing a phase/frequency of a reference signal having a predetermined reference frequency with that of a feedback signal having a predetermined feedback frequency to generate a up pulse and a down pulse according to a phase/frequency difference, wherein the phase/frequency detection means includes two latch circuits and one gate logic circuit; a charge pump means for providing a positive pump current signal and a negative pump current signal in response to the up pulse and the down pulse;

a filter means for converting the positive pump current signal and the negative pump current signal into corresponding voltage signal; and a voltage controlled oscillation means for receiving the voltage signal to generate an output signal having a predetermined oscillation frequency.

Furthermore, the phase-locked loop (PLL) further comprises a filter control means for performing a switching operation in response to the up pulse and the down pulse, thereby changing a resistance of the filter means.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
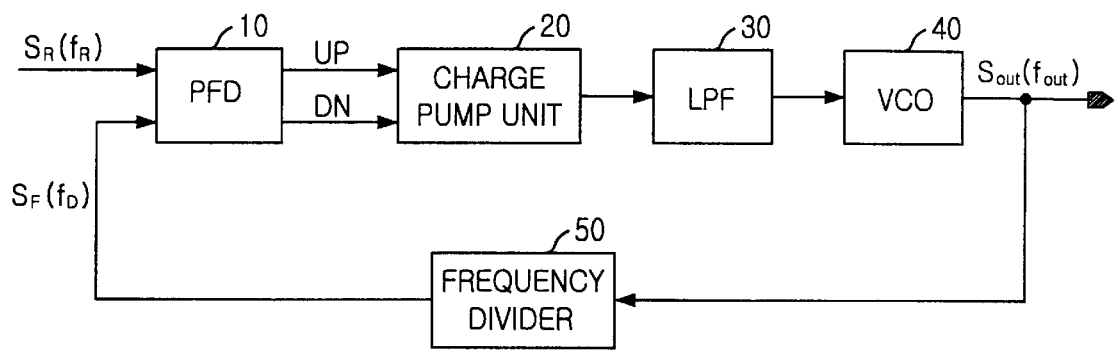
FIG. 1 is a block diagram showing a conventional PLL.
Figure 2:
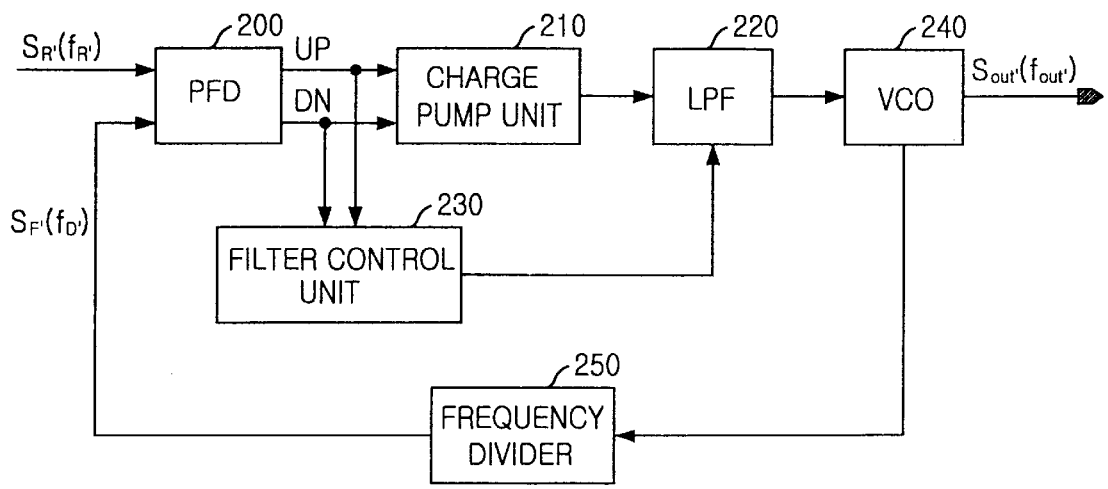
FIG. 2 is a block diagram illustrating a PLL in accordance with the present invention.

FIG. 2 is a block diagram illustrating a PLL in accordance with the present invention.

Referring to FIG. 2, the PLL in accordance with the present invention includes a phase/frequency detector (PFD) 200, a charge pump unit 210, a low-pass filter (LPF) 220, a filter control unit 230, a voltage-controlled oscillator (VCO) 240, and a frequency divider 250.

The PFD 200 receives a reference signal $S_{R'}$ having a predetermined frequency $f_{R'}$ and a feedback signal $S_{F'}$ having a predetermined feedback frequency $f_{D'}$. Then, the PFD 200 compares a phase/frequency of the reference signal $S_{R'}$ with that of the feedback signal $S_{F'}$, to thereby obtain a phase/frequency difference therebetween. Then, the PFD 200 generates a up pulse UP and a down pulse DN according to the phase/frequency difference.

The charge pump unit 210 generates a positive pump current signal and a negative pump current signal in response to the up pulse UP and the down pulse DN, respectively.

The filter control unit 230 controls a bandwidth of the LPF 220 in response to the up pulse UP and the down pulse DN. That is, while the phase/frequency is unlocked, the filter control unit 230 performs a switching operation to change a resistance of the LPF 220. As a result, the bandwidth of the LPF 220 is changed. Meanwhile, if the phase/frequency is locked, the filter control unit 230 is switched off, so that the LPF 220 has its own fixed bandwidth.

The LPF 220 converts the pump current signal into corresponding voltage signal in response to the pump current signal. The LPF 220 implemented with a resistor and a capacitor has a predetermined bandwidth and its bandwidth is controlled by the filter control unit 230.

The VCO 240 receives the voltage signal from the LPF 220 to generate an output signal $S_{OUT}$ having a predetermined oscillation frequency $f_{OUT}$.

The frequency divider 250 divides the oscillation frequency $f_{OUT}$ to output a divided oscillation frequency $f_{D'}$.

The PFD 200 again compares the reference signal $S_{R'}$ having the frequency $f_{R'}$ with the feedback signal $S_{F'}$ having the divided oscillation frequency $f_{D'}$ as the feedback frequency. After repeating the above-described looping operation, the frequency/phase of the reference signal $S_{R'}$ is locked with that of the feedback signal $S_{F'}$.

Figure 3:
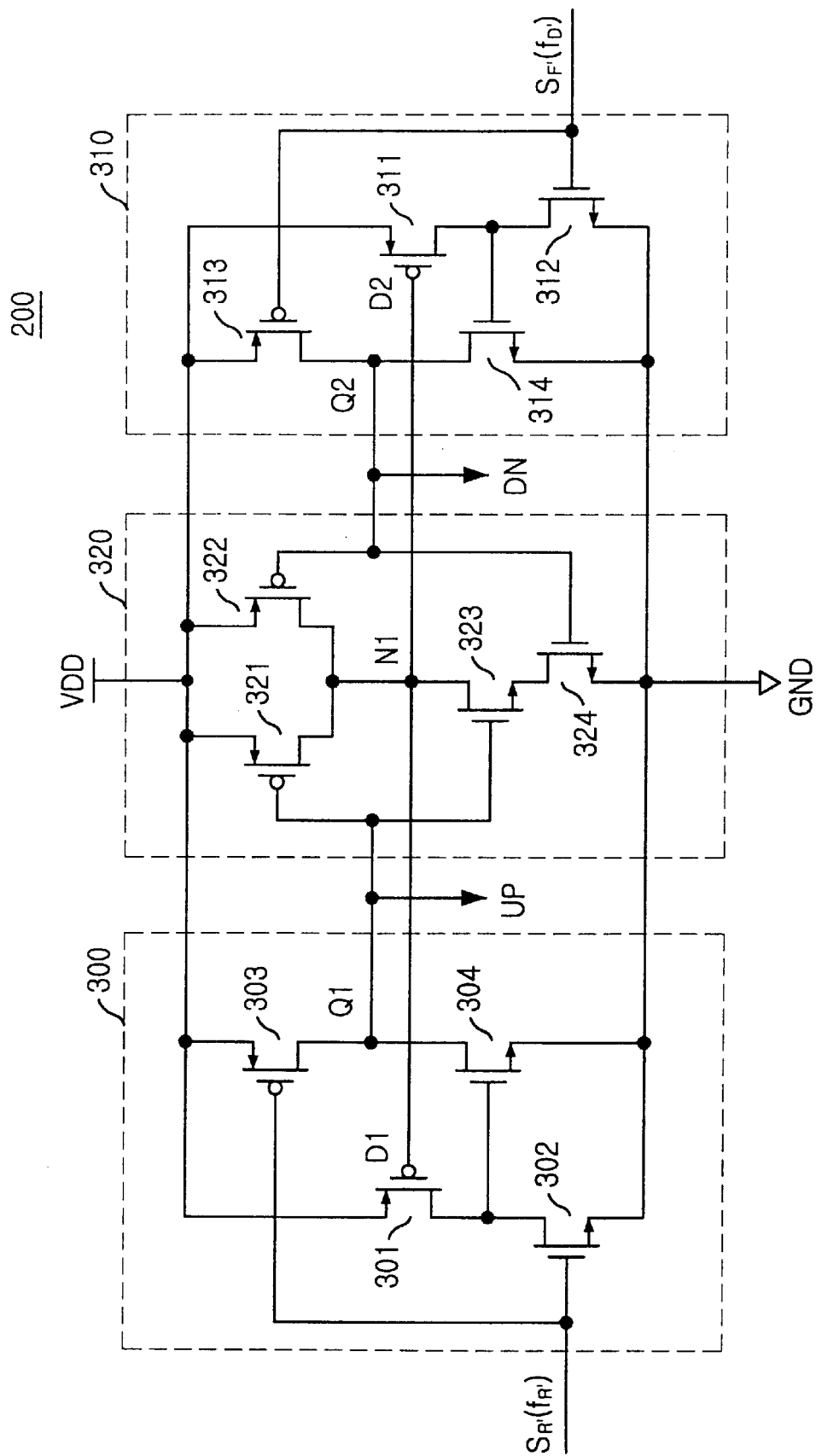
FIG. 3 is a circuit diagram illustrating a PFD shown in FIG. 2.

FIG. 3 is a circuit diagram illustrating the PFD 200 in accordance with the present invention.

Referring to FIG. 3, the PFD 200 includes a first latch circuit 300, a NAND gate logic circuit 320, and a second latch circuit 330.

First, the NAND gate logic circuit 320 NANDs a first output Q1 of the first latch circuit 300 and a second output Q2 of the second latch circuit 310 to output a NANDed signal D1.

The first latch circuit 300 receives and latches the NANDed signal D1 and generates the first output Q1 as the up pulse UP in response to the reference signal $S_{R'}$.

The second latch circuit 310 receives and latches the NANDed signal and generates the second output Q2 as the down pulse DN in response to the feedback signal $S_{F'}$.

The first latch circuit 300 includes: a PMOS transistor 301 having a source coupled to a power terminal VDD and a gate receiving the NANDed signal; an NMOS transistor 302 having a drain coupled to a drain of the PMOS transistor 301, a gate receiving the reference signal $S_{R'}$ and a source coupled to a ground terminal GND; a PMOS transistor 303 having a source coupled to the power terminal VDD and a gate receiving the reference signal $S_{R'}$; and an NMOS transistor 304 having a gate coupled to the drain of the NMOS transistor 302, a drain coupled to a drain of the PMOS transistor and a source coupled to the ground terminal GND. At this time, the up pulse UP is outputted from the drain of the PMOS transistor 303.

The NAND gate logic circuit 320 includes: a PMOS transistor 321, coupled between the power terminal VDD and a node N1, whose gate receives the first output Q1; a PMOS transistor 322, coupled between the power terminal VDD and the node N1, whose gate receives the second output Q2; an NMOS transistor 323 having a drain coupled to the node N1 and a gate receiving the first output Q1; and an NMOS transistor 324 having a drain coupled to a source of the NMOS transistor 323, a gate receiving the second output Q2 and a source coupled to the ground terminal GND. At this time, the node N1 is an output terminal of the NAND gate logic circuit 320.

The second latch circuit 310 includes: a PMOS transistor 311 having a source coupled to the power terminal VDD and a gate receiving the NANDed signal; an NMOS transistor 312 having a drain coupled to a drain of the PMOS transistor 311, a gate receiving the feedback signal $S_{F'}$ and a source coupled to the ground terminal GND; an NMOS transistor 314 having a gate coupled to the drain of the NMOS transistor 312 and a source coupled to the ground terminal GND; and a PMOS transistor 313 having a source coupled to the power terminal VDD, a gate receiving the feedback signal $S_{F'}$ and a drain coupled to the drain of the NMOS transistor 314. At this time, the down pulse DN is outputted from the drain of the PMOS transistor 313.

Figure 4:
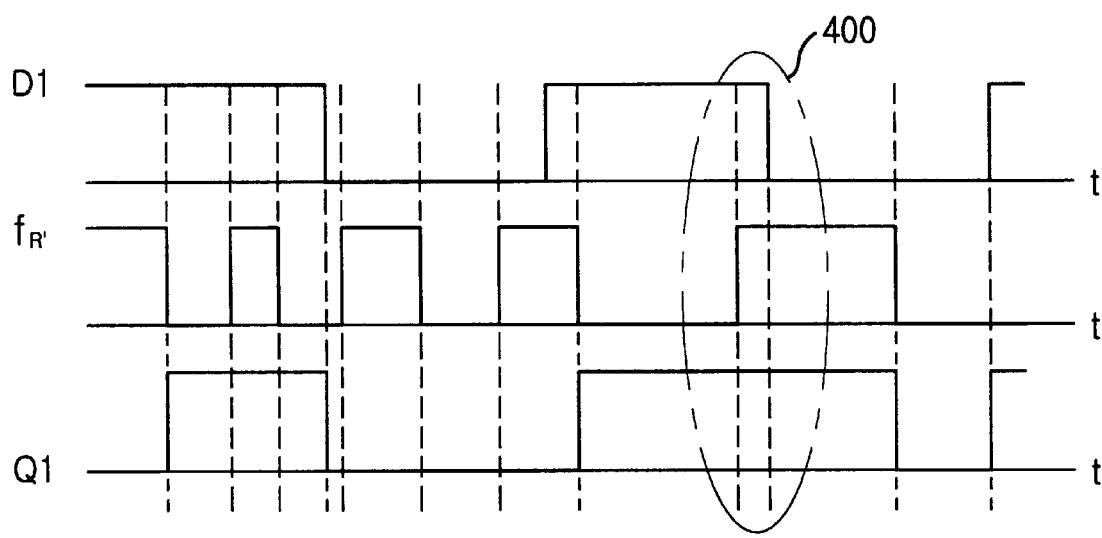
FIG. 4 is a timing chart of a latch circuit in a PFD shown in FIG. 2.

Hereinafter, an operation of the latch circuit 300 contained in the PFD 200 will be described with reference to FIGS. 3 and 4.

In case where the output signal D1 of the NAND gate logic circuit 320 is high and the reference frequency $f_{R'}$ is falling, the first output Q1 is always high. Additionally, in case where the output signal D1 of the NAND gate logic circuit 320 is low, the first output Q1 is always low regardless of the reference frequency $f_{R'}$.

Basically, if the reference frequency $f_{R'}$ is low, the first latch circuit 300 performs a data input operation, and if the reference frequency $f_{R'}$ is high, the first latch circuit 300 performs a data latching operation. That is, if the reference frequency $f_{R'}$ is low and the output signal D1 is falling, the first output Q1 is also falling immediately.

Meanwhile, the conventional PFD detects a negative edge of the reference frequency and generates a reset signal if a negative edge of another frequency is detected. However, as shown in a circle portion 400 of FIG. 4, the PDF in accordance with the present invention does not generate a reset signal if a state of the reference frequency and the feedback frequency is changed. At this time, since there exists a delay time due to the latch circuit and the NAND gate logic circuit, the clock CLK and the input data D1 cannot be falling at the same time.

An operation of the second latch circuit 320 is the same as that of the first latch circuit 300.

Figure 5:
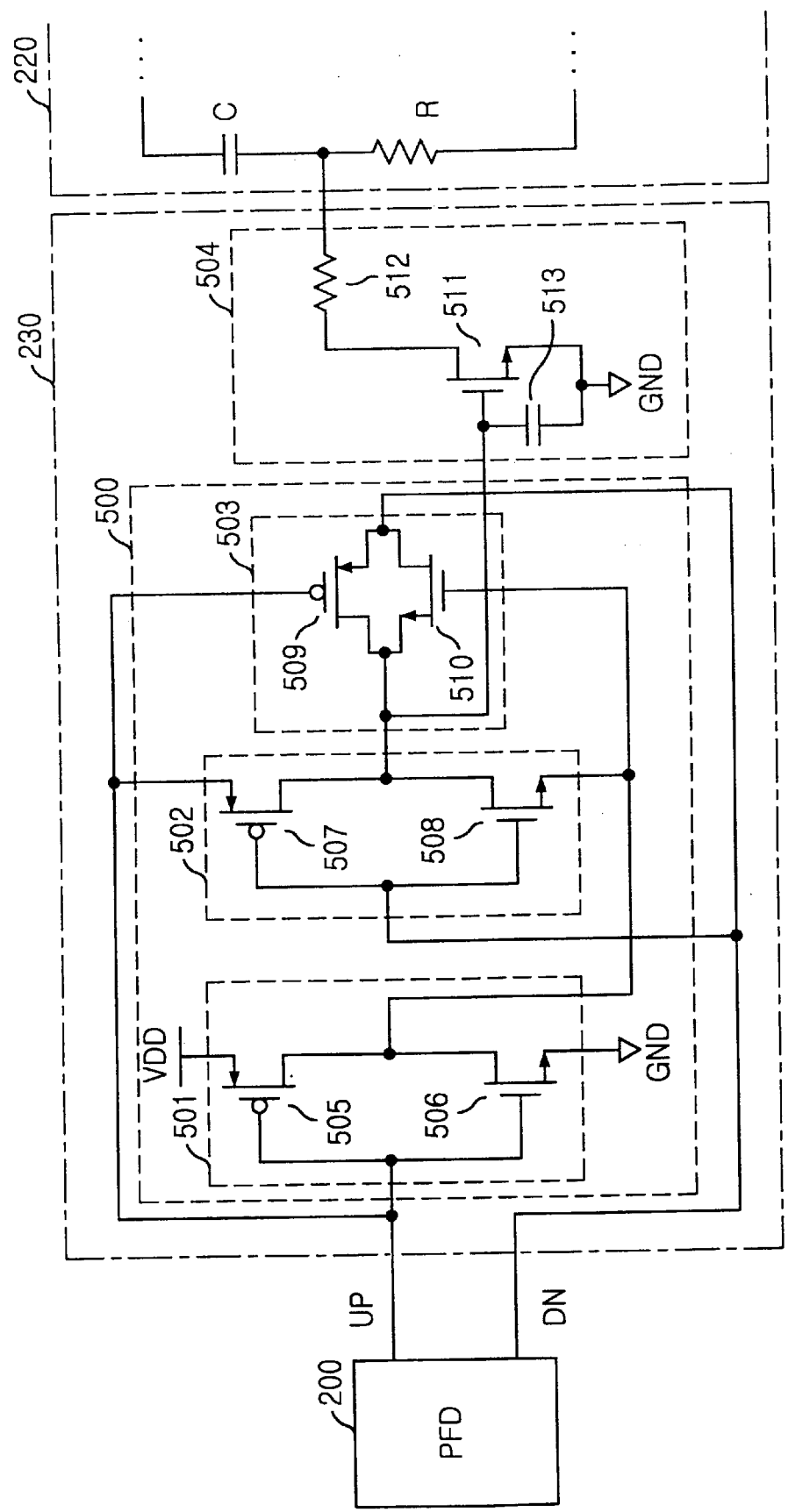
FIG. 5 is a circuit diagram illustrating a filter control unit shown in FIG. 2.

FIG. 5 is a circuit diagram illustrating the filter control unit 230 shown in FIG. 2.

Referring to FIG. 5, the filter control unit 230 includes an Exclusive-OR (XOR) gate 500 and a bandwidth control circuit 504. The XOR gate 500 XORs the up pulse UP and the down pulse DN to output a XORed signal as a control signal. The bandwidth control circuit 504 changes the resistance of the LPF 220 I response to the XORed signal by a switching operation.

The XOR gate 500 in accordance with the present invention includes a first inverter 501, a second inverter 502 and a transmission gate 503.

The first inverter 501 includes: a PMOS transistor 505 having a source coupled to a power terminal VDD and a gate receiving the up pulse UP; and an NMOS transistor 506 having a drain coupled to a drain of the PMOS transistor 505, a gate receiving the up pulse UP and a source coupled to a ground terminal GND.

The second inverter 502 includes: a PMOS transistor 507 having a source coupled to the up pulse UP and a gate receiving the down pulse DN; and an NMOS transistor 508 having a drain coupled to a drain of the PMOS transistor 507, a gate receiving the down pulse DN and a source coupled to an output of the first inverter 501. At this time, the XORed signal is outputted from the drain of the PMOS transistor 507.

The pass gate 503 includes: a PMOS transistor 509 having a source coupled to an output of the second inverter 502, a gate receiving the up pulse UP and a drain coupled to the down pulse DN; and an NMOS transistor 510 having a drain coupled to the source of the PMOS transistor 509, a gate receiving the output of the first inverter 501 and a drain coupled to the down pulse DN.

The bandwidth control circuit 504 includes: an NMOS transistor 511 having a gate receiving the XORed signal and a source coupled to the ground terminal GND; a resistor 512 coupled to a drain of the NMOS transistor 511; and a capacitor 513 coupled between the gate of the NMOS transistor 511 and the ground terminal GND. The capacitor 513 is used to stabilize the PLL with respect to a small phase difference.

At this time, when either the up pulse UP or the down pulse DN is high, the XOR gate logic circuit 500 generates the XORed signal of a high level signal. Then, the NMOS transistor 511 contained in the bandwidth control circuit 504 is turned on in response to the XORed signal. As a result, the resistor 512 is electrically coupled in parallel to a resistor R contained in the LPF 220.

Functionally explaining, during the unlocked period, the bandwidth of the LPF 220 is widened by electrically coupling the resistor 511 to the resistor R. Meanwhile, if the locking is completed, the NMOS transistor 511 is turned off in response to the XORed signal so that the LPF 220 has its own fixed resistance. That is, there is no change in the bandwidth of the LPF 220.

While the conventional PDF is implemented with D-flip flops, the PDF in accordance with the present invention is implemented with the dynamic latch circuits so that the PLL obtains a high-speed operation. Furthermore, since a dead zone is very small, a jitter and a phase noise can be remarkably reduced and a locking time can be also shortened.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase/frequency detector for comparing a phase/frequency of a reference signal having a reference frequency and that of a feedback signal having a feedback frequency in a phase locked loop (PLL), comprising:
    a NAND gate logic circuit for NANDing a first signal first signal and a second signal to output a NANDed signal;
    a first latch means for latching the NANDed signal and outputting the first signal in response to the reference signal; and
    a second latch means for latching the NANDed signal and outputting the second signal in response to the feedback signal.

2. The phase/frequency detector as recited in claim 1, wherein the NAND gate logic circuit includes:
    a first PMOS transistor, coupled between a power terminal and a node, whose gate receives the first signal;
    a second PMOS transistor, coupled between a power terminal and the node, whose gate receives the second signal;
    a first NMOS transistor having a drain coupled to the node and a gate receiving the first signal; and
    a second NMOS transistor having a drain coupled to a drain of the first NMOS transistor, a source coupled to a ground terminal and a gate receiving the second signal.

3. The phase/frequency detector as recited in claim 2, wherein the first latch means includes:
    a third PMOS transistor having a source coupled to the power terminal and a gate receiving the NANDed signal;
    a third NMOS transistor having a drain coupled to a drain of the third PMOS transistor, a source coupled to the ground terminal and a gate receiving the reference signal;
    a fourth PMOS transistor having a source coupled to the power terminal and a gate receiving the reference signal; and
    a fourth NMOS transistor having a drain coupled to a drain of the fourth PMOS transistor, a source coupled to the ground terminal and a gate coupled to the drain of the third PMOS transistor.

4. The phase/frequency detector as recited in claim 3, wherein the second latch means includes:
    a fifth PMOS transistor having a source coupled to the power terminal and a gate receiving the NANDed signal;
    a fifth NMOS transistor having a drain coupled to a drain of the fifth PMOS transistor, a source coupled to the ground terminal and a gate receiving the feedback signal;
    a sixth PMOS transistor having a source coupled to the power terminal and a gate receiving the feedback signal; and
    a sixth NMOS transistor having a drain coupled to a drain of the sixth PMOS transistor, a source coupled to the ground terminal and a gate coupled to the drain of the fifth PMOS transistor.

5. A phase locked loop (PLL) comprising:
    a phase/frequency detection means for comparing a phase/frequency of a reference signal having a predetermined reference frequency with that of a feedback signal having a predetermined feedback frequency to generate a up pulse and a down pulse according to a phase/frequency difference, wherein the phase/frequency detection means includes two latch circuits and one NAND gate;
    a charge pump means for providing a positive pump current signal and a negative pump current signal in response to the up pulse and the down pulse;
    a filter means for converting the positive pump current signal and the negative pump current signal into corresponding voltage signal; and
    a voltage controlled oscillation means for receiving the voltage signal to generate an output signal having a predetermined oscillation frequency.

6. The phase locked loop (PLL) as recited in claim 5, further comprising a frequency division means for diving the predetermined oscillation frequency to output a divided frequency to the phase/frequency detection means as the feedback frequency.

7. The phase locked loop (PLL) as recited in claim 5, wherein the phase/frequency detection means includes:
   a NAND gate for NANDing a first output of a first latch circuit and a second output of a second latch circuit;
   a first latch circuit for receiving and latching an output signal of the NAND gate to output the up pulse in response to the reference signal; and
   a second latch circuit for receiving and latching the output signal of the NAND gate and outputting the down pulse in response to the feedback signal.

8. The phase locked loop (PLL) as recited in claim 7, wherein the first latch circuit includes:
   a first PMOS transistor having a source coupled to a power terminal and a gate receiving the output signal of the NAND gate;
   a first NMOS transistor having a drain coupled to a drain of the first PMOS transistor, a gate receiving the reference signal, and a source coupled to a ground terminal;
   a second NMOS transistor having a gate coupled to the drain of the first NMOS transistor and a source coupled to the ground terminal; and
   a second PMOS transistor having a source coupled to the power terminal, a gate receiving the reference signal, and a drain coupled to the drain of the second NMOS transistor,
   wherein the up pulse signal is outputted from the drain of the second PMOS transistor.

9. The phase locked loop (PLL) as recited in claim 7, wherein the second latch means includes:
   a first PMOS transistor having a source coupled to a power terminal and a gate receiving the output signal of the NAND gate;
   a first NMOS transistor having a drain coupled to a drain of the first PMOS transistor, a gate receiving the feedback signal, and a source coupled to a ground terminal;
   a second NMOS transistor having a gate coupled to the drain of the first NMOS transistor and a source coupled to the ground terminal; and
   a second PMOS transistor having a source coupled to the power terminal, a gate receiving the feedback signal, and a drain coupled to the drain of the second NMOS transistor,
   wherein the down pulse is outputted from the drain of the second PMOS transistor.

10. The phase locked loop (PLL) as recited in claim 7, wherein the NAND gate includes:
    a first PMOS transistor, coupled between a power terminal and a node, having a gate receiving the up pulse;
    a first PMOS transistor, coupled between the power terminal and the node, having a gate receiving the down pulse;
    a first NMOS transistor having a drain coupled to the node and a gate receiving the up pulse; and
    a second NMOS transistor having a drain coupled to a source of the first NMOS transistor, a gate receiving the down pulse, and a source coupled to the ground terminal.

11. The phase locked loop (PLL) as recited in claim 5, further comprising a filter control means for performing a switching operation in response to the up pulse and the down pulse, thereby changing a resistance of the filter means.

12. The phase locked loop (PLL) as recited in claim 11, wherein the filter control means includes:
    an Exclusive-OR (XOR) gate for XORing the up pulse and the down pulse to output a control signal; and
    a switching circuit for performing a switching operation in response to the control signal.

13. The phase locked loop (PLL) as recited in claim 12, wherein the XOR gate includes:
    a first PMOS transistor having a source coupled to a power terminal and a gate receiving the up pulse; and
    a first NMOS transistor having a drain coupled to a drain of the first PMOS transistor, a gate receiving the up pulse, and a source coupled to a ground terminal;
    a second PMOS transistor having a source coupled to the up pulse and a gate receiving the down pulse;
    a second NMOS transistor having a drain coupled to a drain of the second PMOS transistor, a gate receiving the down pulse and a source coupled to an output of the first inverting unit;
    a third PMOS transistor having a source coupled to an output of the second inverting unit, a gate receiving the up pulse, and a drain coupled to the down pulse; and
    a third NMOS transistor having a drain coupled to the source of the third PMOS transistor, a gate receiving the output of the first inverting unit, and a drain coupled to the down pulse.

14. The phase, locked loop (PLL) as recited in claim 13, wherein the switching unit includes:
    a fourth NMOS transistor having a gate receiving the output signal of the second inverting unit and a source coupled to the ground terminal; and
    a resistor coupled to a drain of the fourth NMOS transistor.

15. The phase locked loop (PLL) as recited in claim 14, wherein the switching unit further comprises a capacitor coupled between the gate of the fourth NMOS transistor and the ground terminal.

* * * * *